United States Patent
Farkash et al.

(10) Patent No.: US 7,322,016 B2
(45) Date of Patent: Jan. 22, 2008

(54) IMPACT CHECKING TECHNIQUE

(75) Inventors: Monica Farkash, Haifa (IL); Shmuel Ur, D.N. Misgav (IL)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 11/034,420

(22) Filed: Jan. 11, 2005

(65) Prior Publication Data
US 2006/0156261 A1 Jul. 13, 2006

(51) Int. Cl.
*G06F 17/50* (2006.01)

(52) U.S. Cl. .................................... 716/4; 716/5
(58) Field of Classification Search .............. 716/1–5, 716/18; 703/2
See application file for complete search history.

(56) References Cited

U.S. PATENT DOCUMENTS

| | | | |
|---|---|---|---|
| 6,131,078 A * | 10/2000 | Plaisted ........................ 703/2 |
| 6,148,436 A * | 11/2000 | Wohl ........................... 716/18 |
| 6,216,252 B1 * | 4/2001 | Dangelo et al. ................ 716/1 |
| 6,405,351 B1 * | 6/2002 | Steiss et al. ................... 716/5 |
| 6,611,947 B1 * | 8/2003 | Higgins et al. ................ 716/5 |
| 6,665,844 B1 * | 12/2003 | Stanion ......................... 716/5 |
| 2002/0138812 A1 * | 9/2002 | Johannsen .................... 716/5 |
| 2003/0158720 A1 * | 8/2003 | Liu ............................. 703/17 |
| 2003/0225552 A1 * | 12/2003 | Ganai et al. ................... 703/2 |
| 2003/0229863 A1 * | 12/2003 | Narain et al. .................. 716/4 |
| 2005/0166167 A1 * | 7/2005 | Ivancic et al. ................. 716/5 |

* cited by examiner

Primary Examiner—Paul Dinh

(57) ABSTRACT

A method includes determining whether or not a statement in a design has any functionality. The functionality includes impact on the operation of the design. Also included in the invention is in impact checker to determine the impact of portions of the design on the operation of the design.

6 Claims, 6 Drawing Sheets

(a1 iff a2) and (b1 iff b2)

IMPACT CHECKING TECHNIQUE

FIELD OF THE INVENTION

The present invention relates to formal verification techniques generally.

BACKGROUND OF THE INVENTION

Formal verification is now an industrial strength solution that is used on small designs, or design components, to identify bugs. Model checkers are used to check if desired properties hold on a design. Equivalence checkers are used to show that two designs, usually at different abstraction levels (e.g. verilog vs. netlist), are equivalent.

Equivalence checkers can verify equivalence between RTL (Register Transfer Level) descriptions, RTL design and gate-level design, between gate-level designs, and between gate-to-transistor comparisons. They employ formal mathematical techniques to prove that two versions of a design are functionally equivalent.

A model checker reviews a single model. Given the model and a set of desired properties, the model checker explores the full state space of the model to check whether the given properties are satisfied by the model. The model checker either verifies the given properties or generates counter examples. There are cases in which the model checker, due to the size of the problem, cannot provide any conclusive answers to the problem.

The main barrier for the general acceptance of these and other formal verification tools is that they require highly skilled users. For example, model checkers require that assertions be written and that they be written in temporal logic. Towards enabling the use of the tools by less sophisticated users, the idea of implied intent was raised. Generally speaking, systems for implied intent attempt to look at the code, figure out what the user meant for the code or the design to implement, and check, using the formal tools, if it is implemented.

The concept of "Coverability", as described by Gil Ratsaby, Baruch Sterin and Shmuel Ur in "Improvements in Coverability Analysis". FME 2002: 41-56, checks, for example, that every statement in a program is reachable.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
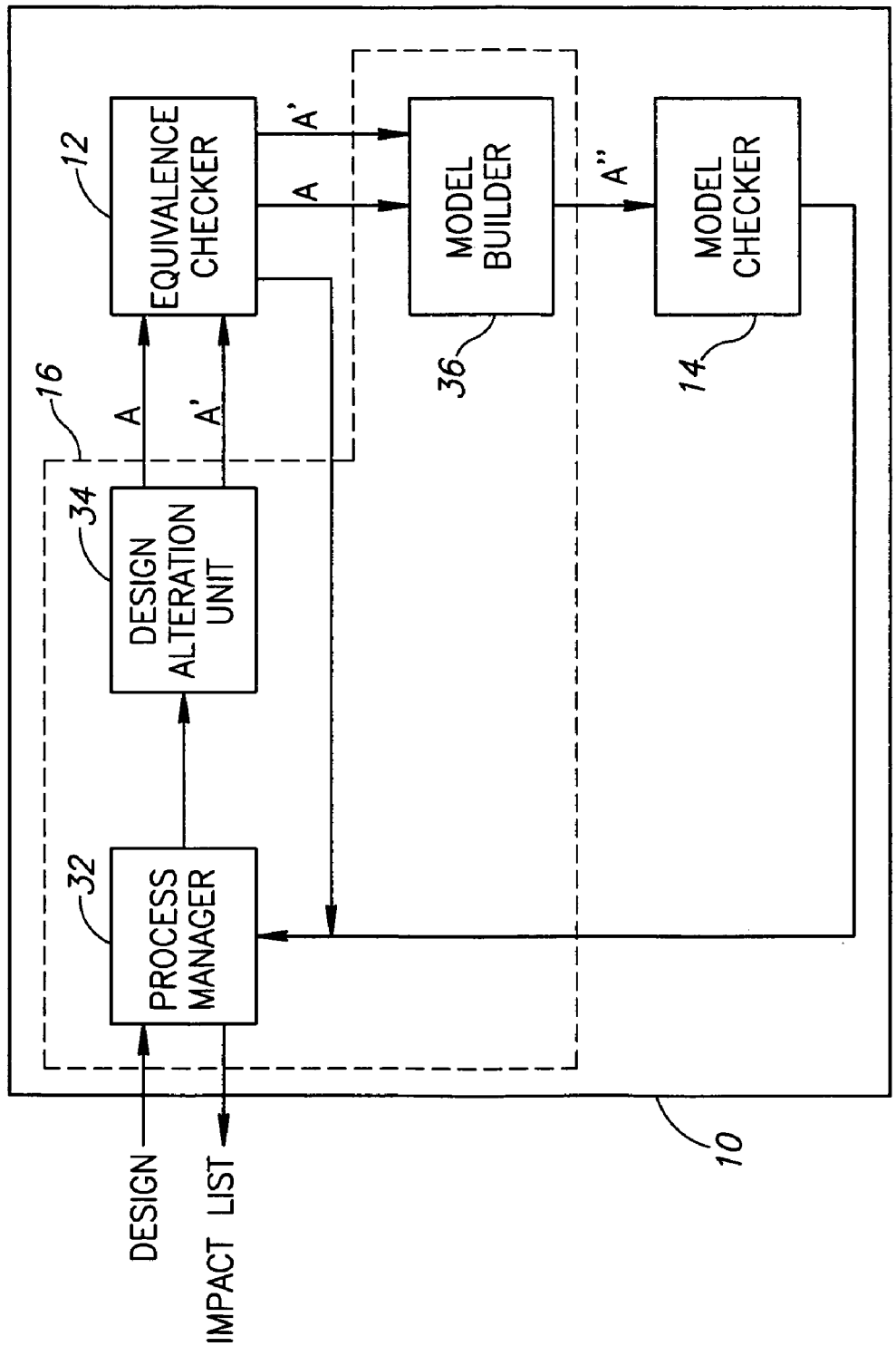
FIG. 1 is a block diagram illustration of an impact checker, constructed and operative in accordance with the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals can be repeated among the figures to indicate corresponding or analogous elements.

SUMMARY OF THE PRESENT INVENTION

The present invention is an improved formal verification technique, useful for less sophisticated users. The present invention determines whether or not a statement in a design has any functionality, or impact on the operation of the design.

There is therefore provided, in accordance with a preferred embodiment of the present invention, a unit including a design receiver and an impact checker. The design receiver receives a design to be checked. The impact checker determines the impact of portions of the design on the operation of the design.

Additionally, in accordance with a preferred embodiment of the present invention, the impact checker includes an equivalence checker, a model checker and an operating unit to operate both the checkers on the design and on an altered version of the design.

Moreover, in accordance with a preferred embodiment of the present invention, the altered version is the design with a component of the design removed therefrom.

Further, in accordance with a preferred embodiment of the present invention, the operating unit includes a design alteration unit and a model builder. The design alteration unit generates at least one the altered version by removing at least one the component. The model builder builds a composite model of the design and the altered version for the model checker.

Alternatively, in accordance with a preferred embodiment of the present invention, the impact checker includes a state reviewer and a process manager. The state reviewer determines when a variable is no longer present in BDDs representing states of the design. The process manager sequentially marks statements of the design with the variable.

Moreover, in accordance with a preferred embodiment of the present invention, the operating unit includes a statement selector to determine which statements to review for impact.

There is also included, in accordance with a preferred embodiment of the present invention, a method including determining whether or not a statement in a design has any functionality.

Additionally, in accordance with a preferred embodiment of the present invention, the determining step includes generating an altered version of the design with the statement removed and providing the altered version and the design to an equivalence checker and a model checker.

Moreover, in accordance with a preferred embodiment of the present invention, the method also includes building a composite model of the design and the altered version for the model checker.

Alternatively, in accordance with a preferred embodiment of the present invention, the determining step includes sequentially marking statements of the design with a variable and reviewing BDDs representing states of the design to determine when the variable is no longer present in them.

Further, in accordance with a preferred embodiment of the present invention, the generating step includes determining which statements to review for impact.

There is also provided, in accordance with a preferred embodiment of the present invention, a computer product readable by a machine, tangibly embodying a program of instructions executable by the machine to perform method steps. The method steps are discussed hereinabove.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2:
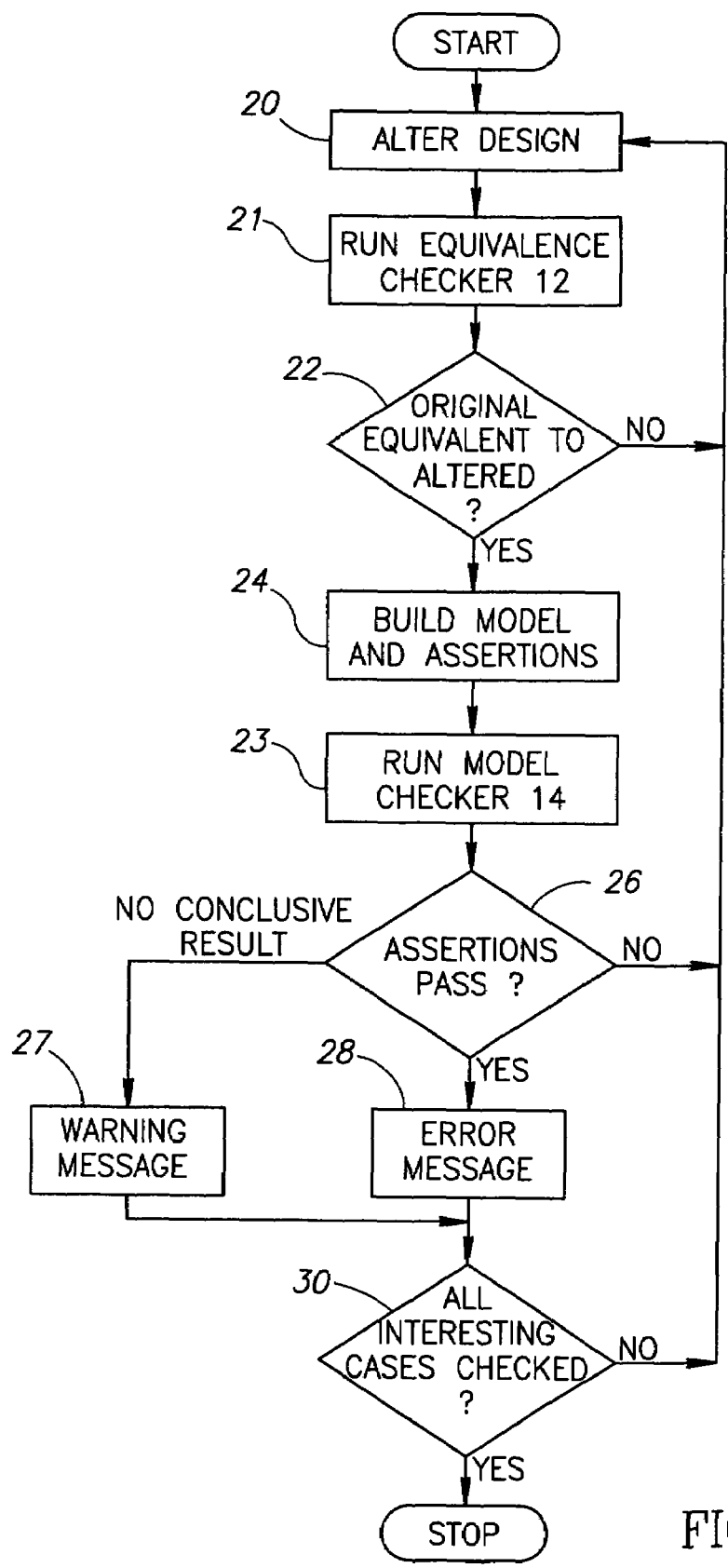
FIG. 2 is a flow chart illustration of the operation of the impact checker of FIG. 1.

Reference is now made to FIG. 1, which illustrates an impact checker 10, constructed and operative in accordance with the present invention, and to FIG. 2 which illustrates its operation. Impact checker 10 may determine whether or not selectable portions of a design (or of software code) may have an impact on the final output. A design developer may utilize this information to determine which portions of the existing design or software code no longer affect its output. The developer may then decide to remove the ineffective portions of the design or code.

The design may be written in verilog, netlist, RTL (Register Transfer Level) or gate-level descriptions.

In accordance with a preferred embodiment of the present invention, impact checker 10 may receive an original design A to be checked, may check all the components or portions thereof and may generate an impact list listing any components or portions thereof that have no effect on the final output. Impact checker 10 may be a relatively simple tool for a user to use even though, as will be explained hereinbelow, it may utilize very sophisticated verification technologies. Moreover, impact checker 10 may determine if a component has an impact, which may be a stronger indication of a bug than whether or not the component was activated, as has been checked in the prior art.

Impact checker 10 may comprise an equivalence checker 12, a model checker 14 and an operating unit 16. Equivalence checker 12 may be any suitable equivalence checker. The following is a list of currently available equivalence checkers: FORMALITY, commercially available from Synopsys Inc. of Mountain View, Calif., USA, CONFORMAL, commercially available from Cadence Design Systems of San Jose, Calif., USA, Formalpro, commercially available from Mentor Graphics of Wilsonville, Oreg., USA, and QUARTZ FORMAL, commercially available from Magma Design Automation Inc. of Santa Clara, Calif., USA. Model checker 14 may be any suitable model checker. The following is a list of currently available model checkers: RULEBASE, commercially available from International Business Machines Inc. of the USA, BLACKTIE, commercially available from Synopsys, and FORMALCHECK, commercially available from Cadence Design Systems.

Operating unit 16 may operate equivalence checker 12 and model checker 14 on original design A and an altered version A' of the original design. For example, let S be a list of components $S_i$ of design A that the user would like to see if they impact the result of original design A, where a "component" may be a statement, condition, portion of a condition and/or a value for an enumerated variable in original design A.

For each component $S_i$, unit 16 may create (step 20, FIG. 2) altered design A' that does not contain component $S_i$. Operating unit 16 may send (step 21) original design A and altered design A' through equivalence checker 12 to determine (step 22) if original design A is equivalent to altered design A'. If the two designs do not behave the same, then the alteration was significant, hence removed component $S_i$ was relevant. Operating unit 16 may return to step 20 to choose another significant alteration of the original design.

If the two designs are proven equivalent up to a certain number of steps, (a process known as a "bounded proof"), then equivalence checker 12 was not able to provide a definite answer. It could still be that original design A and altered design A' are equivalent, or it could be that their behavior only starts to differ after a certain number M of cycles, where M may not be reached by the bounded verifier.

In this case, operating unit 16 may prepare designs A and A' for model checker 14. Operating unit 16 may merge (step 24) the two designs A and A' into a single, composite model A" that contains both behaviors: the behavior of original design A and the behavior of altered design A'. Operating unit 16 may also generate a set of "assertions" for the combined model that model checker 14 will check. "Assertions" are properties that can be proven true or false by further processing. In accordance with a preferred embodiment of the present invention, the assertions may state that altered model A' and original model A behave identically.

Operating unit 16 may then run (step 23) model checker 14 to validate the assertions on composite model A". If the assertions are not valid, then the alteration was relevant to the behavior of the original model, and operating unit 16 may return to step 20 to choose another significant alteration of the original design. If altered design A' and original design A behave identically, then removed component $S_i$ has no impact and operating unit 16 may send (step 28) an error flag to the user with all the data needed to locate removed component $S_i$. If model checker 14 failed to prove one way or the other, such as might occur due to size problems, operating unit 16 may send (step 27) a warning to the user which may ask him or her to take a closer look at removed component $S_i$.

Operating unit 16 may check (step 30) that all removed components $S_i$ have been checked and, if not, may return to step 20 for another component.

It will be appreciated that the warnings and error reports may be provided during operation of operating unit 16 or as a report listing each component $S_i$ of original design A which was found suspect in some way.

Returning to FIG. 1, operating unit 16 may comprise a process manager 32, a design alteration unit 34 and a model builder 36. Process manager 32 may receive original design A and may manage the operations of design alteration unit 34, model builder 36, equivalence checker 12 and model checker 14. Design alteration unit 34 may prepare each altered design A' and model builder 36 may generate composite model A" and the assertions for it.

Process manager 32 may receive original design A and may generate the following information:

a) error messages—stating which component $S_i$ is not actually used;

b) warning messages—stating which component $S_i$ should be manually inspected for effectiveness; and c) "behavioral" coverage acknowledgement—which components $S_i$ have been analyzed for coverage and which tool (equivalence checker 12 or model checker 14) verified them.

Process manager 32 may implement the method of FIG. 2 and may do so sequentially or in a parallel pipeline. Initially, it may send original design A to design alteration unit 34. Unit 34 may return altered design A' or an indication that it (unit 34) may have finished all of the alterations that it considers significant.

Process manager 32 may run equivalence checker 12 on the two designs A and A'. Equivalence checker 12 may respond if altered design A' may be equivalent to original design A. If the two designs are not equivalent, process manager 32 may ask alteration unit 34 to provide another altered model and may store information regarding the proven coverage. If equivalence checker 12 replies that the models are equivalent up to a certain number of cycles, process manager 32 may continue with the investigation and may send original design A and altered design A' to model builder 36. Unit 36 may return composite model A" and a set of assertions for model checking.

Process manager 32 may operate model checker 14 with these assertions on composite model A". Model checker 14 may return one of the following answers:

a) Original design A and altered design A' have identical behaviors. If so, process manager 32 may generate an error message;

b) Original design A and altered design A' behave differently. If so, process manager 32 may acknowledge the coverage of component $S_i$; and c) The result was inconclusive. If so, process manager 32 may generate a warning.

Process manager 32 may ask alteration unit 34 for alterations one after the other and may run the altered designs in parallel, in a pipelined architecture, such that, while equivalence checker 12 may work on original design A and altered design $A^B$, model checker 14 may operate on a different pair of designs, such as original design A and altered A'.

Design alteration unit 34 may generate another design that is almost identical to the initial design with the exception of a well defined, small, component. For software designs, or hardware designs designed in software, the component being removed should be well defined, so that, when model builder 36 may attempt to compile it, altered design A' may compile. In one exemplary embodiment, design alteration unit 34 may identify statements within original design A, where a "statement" is defined by the language used to write the design. Typically, the language may have a well defined grammar in which statements are defined as are how to identify their beginning and end. For example, a statement in C++, a common programming language, might be:

statement:
    labeled_statement/
    compound_statement/
    expression_statement/
    selection_statement/
    iteration_statement/
    jump_statement/
    declaration;

The grammar may contain clear definitions of each of the above statements. For example:

labeled_statement label ':' statement
    /CASE constant_expression ':' statement
    /DEFAULT ':' statement;

Design alteration unit 34 may comprise a parser for the language of original design A. Since the parser may know the grammar of the language, the parser may identify statements. Design alteration unit 34 may then generate altered design A' by rewriting original design A with all statements but the one statement to be removed. Design alteration unit 34 may also comprise a counter to maintain a record of how many previous statements were already removed and an indicator to indicate when altered designs A' have been generated for all statements in original design A.

In an alternative embodiment, the number of statements to be verified for "behavioral" coverage may be decreased by utilizing various optimizations. Some of these optimizations are discussed in US Patent Publication 2003/0110474, which is incorporated herein by reference. For example, certain types of statements, such as declarations, may be excluded from generating altered design A'. In a further alternative embodiment, the user may indicate which statements to verify (if s/he wanted to check only a portion of the design). In a further alternative embodiment, design alteration unit 34 may remove other components, such as a pre-defined list of variables or processes.

Figure 3:
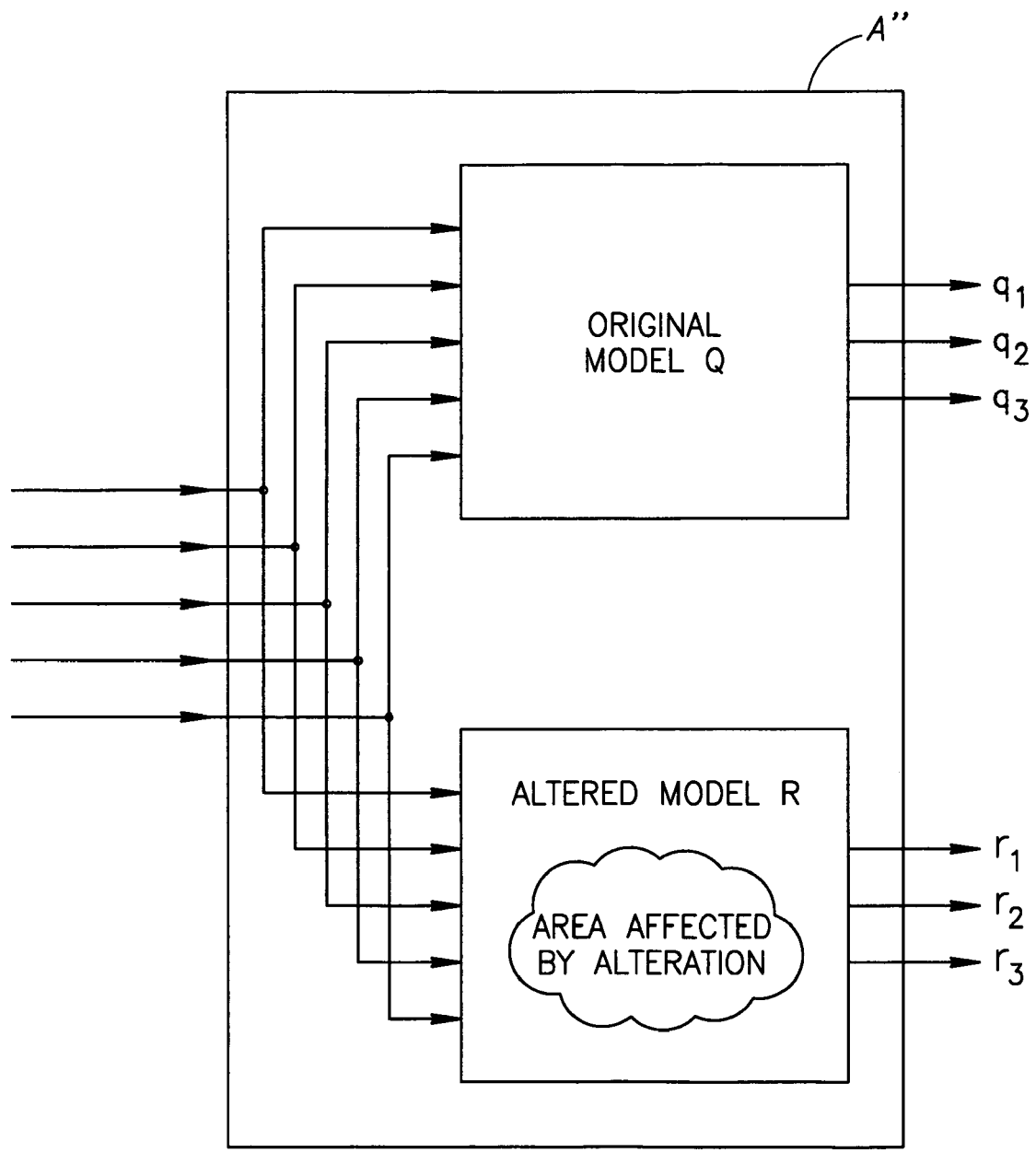
FIG. 3 is a schematic illustration of the merger of two designs into a single design, useful in understanding the operation of the impact checker of FIG. 1.

Model builder 36 may compile original design A and altered design A' to generate two register transfer level (RTL) "models" Q and R by compiling the code of both original design A and altered design A' with an HDL compiler. For example, the HDL compiler, Portals by IBM, may take HDL code (VHDL, Verilog) as input and may generate RTL code with the same functionality as the input code. Model builder 36 may merge the RTL models into composite model A". As shown in FIG. 3, to which reference is now made, the merger may be done as follows: all input signals for model Q may be input signals for model R and vice versa, such that both models may be fed with the same input on all cycles. Model Q may produce output signals $q_i$ and model R may produce output signals $r_i$. FIG. 3 shows three output signals for each model; it will be appreciated that this is exemplary only.

Model builder 36 may also generate assertions for composite model A". These assertions may state that no matter what the input signals may be, the output signals will behave identically. In the example of FIG. 3, the assertion may be:

$$\text{always}((q_1=r_1)\&(q_2=r_2)\&(q_3=r_3))$$

Moreover, as opposed to most model checking operations where there are restrictions on the input signals to ensure correct behavior, model builder 36 may enable a totally free environment, where all input signals may take any value at any time. In the present invention, if models Q and R behave in the same way without restricting the input to legal input, then they will behave identically also under the subset of legal input.

Figure 4:
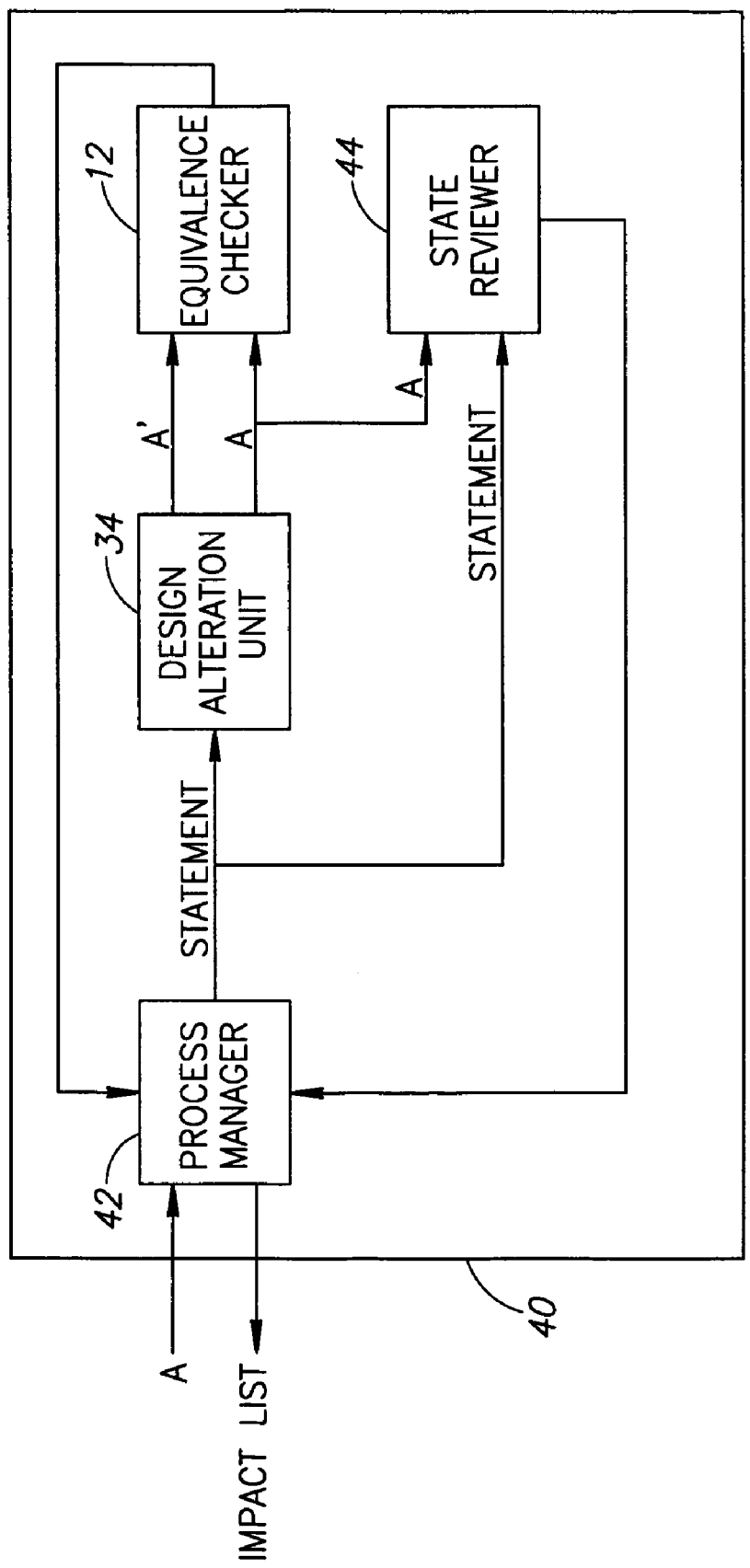
FIG. 4 is a block diagram illustration of an alternative embodiment of the impact checker, constructed and operative in accordance with the present invention.

Reference is now made to FIG. 4, which illustrates an alternative embodiment of the impact checker, here labeled 40. In this embodiment, there is no model checker 14, and thus, no model and assertion builder 36. Instead, there is a state reviewer 44, which may receive the original design model A and the statement to be removed and may review the states of the design to determine if the statement to be removed has an affect.

State reviewer 44 may perform many of the same operations as a model checker. The article by C. Eisner, "Using Symbolic CTL Model Checking to Verify the Railway Stations of Horn-Kersenboogerd and Heerhugowaard", *Soft-* ware *Tools for Technology Transfer*, Vol. 4, number 1, pp. 107-124, includes a nice tutorial on the process of symbolic model checking. An exemplary model checker may be Rulebase, commercially available from International Business Machines Inc. (IBM) of the USA, which includes in it a symbolic model checker.

Figure 5:
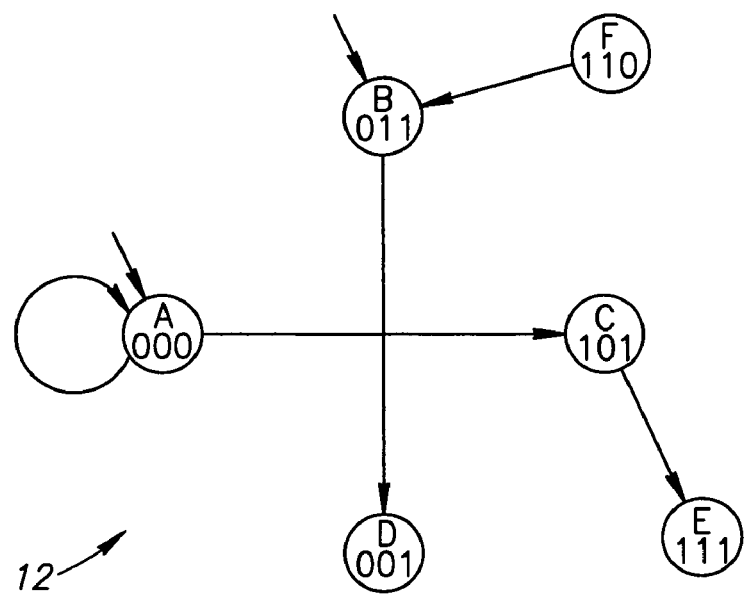
FIG. 5 is an illustration of a simple state machine with six states, useful in understanding the operation of the impact checker of FIG. 4.

One of the important functions of symbolic model checkers is to determine which group RS of states of a model may be reached from an initial group $S_0$ of states and which cannot be reached. This is known as "reachability". FIG. 5, to which reference is now briefly made, is an illustration of a state machine 52 with six states, A, B, C, D, E and F. Each state represents one particular set of assignments of three state variables ($v_1$, $v_2$, $v_3$) forming a state vector c. Thus, for example, state A is the state with the values (0,0,0) while state C is the state with the values (1,0,1).

State machine 52 moves through the states as indicated by the arrows on FIG. 5. Thus, state machine 52 may remain at state A or it may proceed to state C and from there to state E or it may begin at state B and move to state D. This movement through the groups of state is defined, in symbolic model checking, by a "transition relation" R from one state vector $\bar{v}$ to a "next" state vector $\bar{v}'$. For state machine 12, transition relation R is:

$$R(\bar{v}, \bar{v}') = \begin{Bmatrix} (000, 000) \\ (000, 101) \\ (011, 001) \\ (101, 111) \\ (110, 011) \end{Bmatrix}$$

From the initial group $S_0$ of states {A, B}, the state machine may get to the group $S_1$ of states {A, C, D} in one step. State A has already been explored and thus, the next step is to explore states C and D. From the group {C, D}, the state machine can get to the group $S_2$ comprised of state E. Since state E has no outward going arrow, the model checker is finished. From these results, the reachable states are A, B, C and D. State F is not reachable from any of the initial states.

A model checker may operate on the graph of FIG. 5 and may follow the arrows, looking for states. A symbolic model checker may perform its checking through use of a symbolic representation of the graph, rather than the graph itself. One such symbolic representation is a binary decision diagram (BDD), which is a generally compact representation of a Boolean expression.

Figure 6:
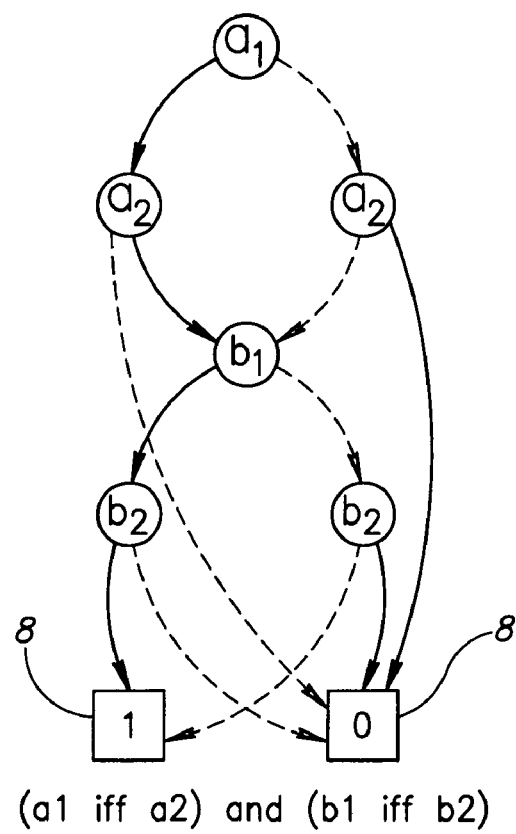
FIG. 6 is a schematic illustration of an exemplary BDD, useful in understanding the operation of the impact checker of FIG. 4.

A BDD is a directed acyclic graph that represents a Boolean expression. FIG. 6, to which reference may be now briefly made, shows an exemplary BDD for the expression ((a1 iff a2) and (b1 iff b2)), where "iff" stands for "if and only if". Each circle indicates a variable (a1, a2, b1, b2) and the lines indicate the directions to follow when the variable has a value of 0 (dashed lines) or 1 (solid lines). For each BDD, there may be two terminal nodes 8 representing the result of the Boolean expression.

Boolean operations may be performed on a BDD. Since such operations often increase the size of a BDD, there also exist operations to compact the BDD. The compaction process involves removing any variables present in the BDD which have no effect on the terminal node of the BDD. For example, if one terminal node is reached from a variable no matter what value the variable takes, then the variable has no effect on the BDD.

In accordance with a preferred embodiment of the present invention, state reviewer 44 (FIG. 4) may review BDDs periodically to determine if a variable of interest is present. The variable of interest may represent the statement to be checked, as explained hereinbelow. If the variable of interest exists, then the statement has an effect. If it does not exist in the BDD, then the variable of interest has no effect and thus, the statement to be removed has no effect.

It will be appreciated that how state reviewer 44 may compact its BDD may have an effect on which variables are removed and which ones remain despite no longer being relevant. Despite this, state reviewer 44 may determine that, if the variable of interest does not exist in the BDD, then the statement to be removed has no effect.

Figure 7:
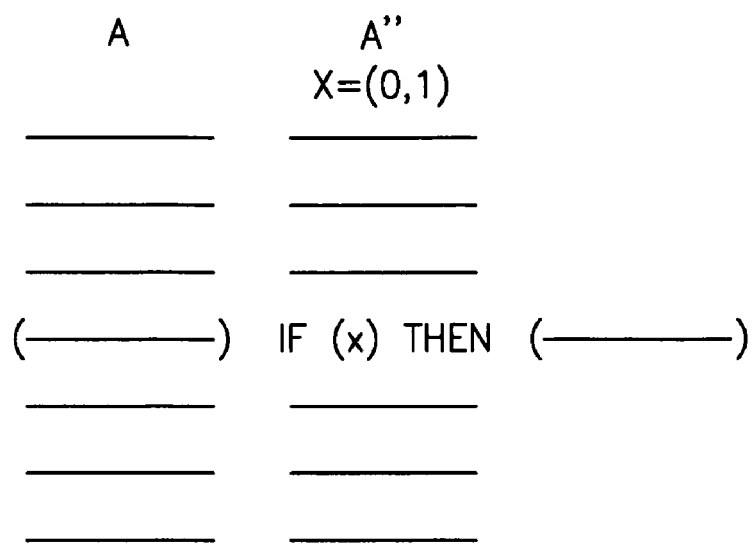
FIG. 7 is a schematic illustration of two designs, useful in understanding the operation of the impact checker of FIG. 4.

Reference is now briefly made to FIG. 7, which illustrates two designs, the original design A and a new design A". A statement to be checked is marked in original design A with parentheses. State reviewer 44 may initially generate new design A" by adding a new variable x, defined in the beginning of new design A" as having a value set of (1,0), and by turning the statement to be checked into an if statement using x. Thus, the statement becomes "if (x), then the statement".

State reviewer 44 may then review new design A" to determine if the variable x has any effect. To do so, state reviewer 44 may define a desired value for an output variable $O_i$, or values for a set of output variables O, and may attempt to determine if variable x has an effect on the output variable(s). This is illustrated in FIG. 8, to which reference is now made.

Figure 8:
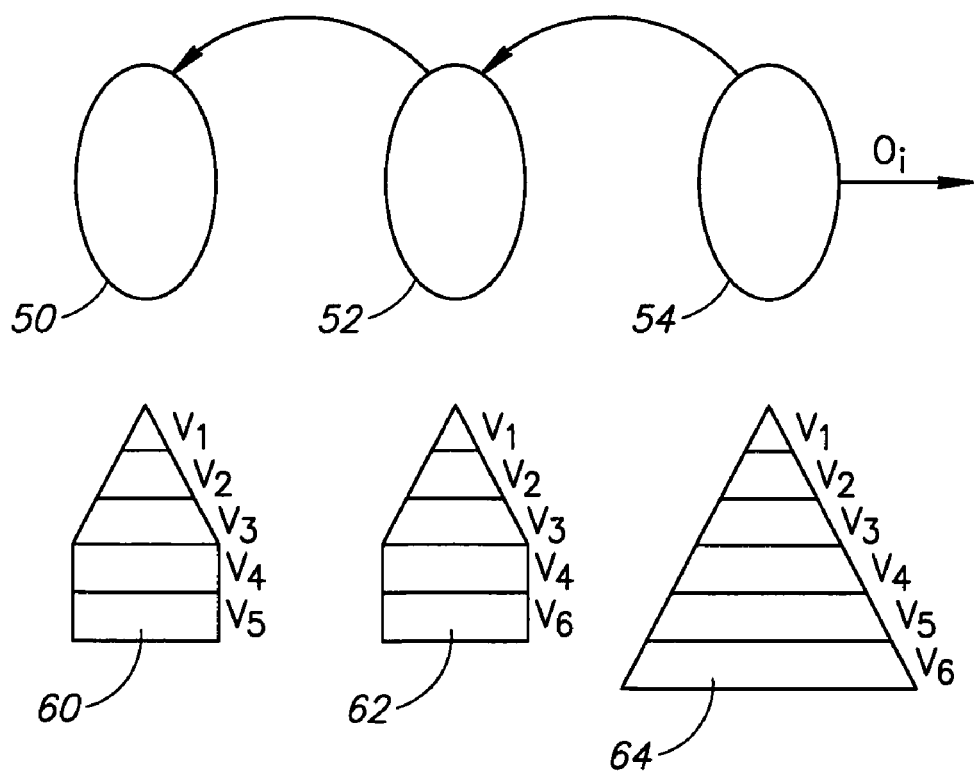
FIG. 8 is a schematic illustration of three states and their binary decision diagrams, useful in understanding the operation of the impact checker of FIG. 4.

In FIG. 8, there are three states shown, as ovals 50, 52 and 54. State 54 is the last state, producing output variables O. State 52 is the state prior to state 54 and state 50 is the state prior to state 52. Most symbolic model checkers include in them the ability to compute a previous state from a current one. This is known as "pre-image" computation (the forward calculation being the "image" computation). Thus, the model checker may determine state 52 from state 54 through the pre-image computation.

The image computation of $S_i$ uses transition relation R to move to the next group of states $S_{i+1}$. The pre-image computation of $S_i$ uses transition relation R to take a step backwards to the group of states $S_{i-1}$.

More precisely:

$$\text{image}(S(\bar{v}), R(\bar{v}, \bar{v}')) = \exists \bar{v}(S(\bar{v}) \wedge R(\bar{v},\bar{v}'))$$

and $$\text{pre\_image}(S(\bar{v}'), R(\bar{v},\bar{v}')) = \exists \bar{v}'(S(\bar{v}') \wedge R(\bar{v},\bar{v}'))$$

where $S(\bar{v})$ and $R(\bar{v},\bar{v}')$ are BDDs representing a group of states S and a transition relation R, respectively, $\exists$ is the 'exist' function and ^ is the 'and' function. Computing $\exists z A(\bar{v})$ may be referred to as "quantifying z out of A". Existential quantification may reduce the size of the BDD and may remove unnecessary variables from the output BDD. This is shown in FIG. 8 in the BDDs for each state. State 54, the last state, has a large BDD 64, state 52 has a smaller BDD 62 and state 50 has a somewhat smaller BDD 60.

Each level in the BDDs, such as BDD 60, 62 and 64, refers to a different variable. If a variable has been removed, then its entire level has been removed. State reviewer 44 may review the output BDD after each pre-image computation to determine if the variable x still exists in the output BDD (i.e. if the level associated with the variable x still exists in the output BDD).

If it does, state reviewer 44 may perform the next pre-image computation, to move backwards once again. In the simple example of FIG. 8, the variable $v_6$ exists in BDDs 64 and 62 but not in BDD 60. If variable $v_6$ is the variable of interest, then state reviewer 44 may stop its calculations at state 50.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for checking for an impact of a component of a design, the method comprising:

receiving a design for review;

generating an altered version of said design with said component removed;

providing said altered version and said design to at least one of an equivalence checker and a model checker; and indicating that said impact exists if said at least one of said equivalence checker and said model checker determines that a difference exists between outputs of said altered version and said design wherein said determining comprises: sequentially marking components of said design with a variable; and reviewing BDDs representing states of said design to determine when said variable is no longer present in the BDDs, and wherein said generating comprises determining which components to remove.

2. The method according to claim 1 and also comprising:
   building a composite model of said design and said altered version for said model checker.

3. The method according to claim 1 and wherein said component comprises at least one of the following: a statement, a condition, a portion of a condition, and a value for an enumerated variable in said design.

4. A computer product readable by a machine, tangibly embodying a program of instructions executable by the machine to perform method steps, the method steps comprising:

receiving a design for review;

generating an altered version of said design with a component removed;

providing said altered version and said design to at least one of an equivalence checker and a model checker; and indicating that said impact exists if said at least one of said equivalence checker and said model checker determines that a difference exists between outputs of said altered version and said design wherein said determining comprises: sequentially marking components of said design with a variable; and reviewing BDDs representing states of said design to determine when said variable is no longer present in the BDDs, and wherein said generating comprises determining which components to remove.

5. The product according to claim 4 and also comprising:
   building a composite model of said design and said altered version for said model checker.

6. The product according to claim 4 and wherein said component comprises at least one of the following: a statement, a condition, a portion of a condition, and a value for an enumerated variable in said design.

\* \* \* \* \*